United States Patent [19]

Oabayashi

[11] Patent Number: 5,071,517

[45] Date of Patent: Dec. 10, 1991

[54] METHOD FOR DIRECTLY ELECTROPLATING A DIELECTRIC SUBSTRATE AND PLATED SUBSTRATE SO PRODUCED

[75] Inventor: Kiyoshi Oabayashi, Tokyo, Japan

[73] Assignee: Solution Technology Systems, Redlands, Calif.

[21] Appl. No.: 440,661

[22] Filed: Nov. 21, 1989

[51] Int. Cl.$^5$ .................... C25D 5/02; C25D 5/54
[52] U.S. Cl. .................................. 205/12; 205/158
[58] Field of Search ............... 204/15, 20, 30, 38.4

[56] References Cited

U.S. PATENT DOCUMENTS

| | | | |
|---|---|---|---|
| 3,099,608 | 7/1963 | Radovsky et al. | 204/15 |
| 3,904,792 | 9/1975 | Gulla et al. | 427/304 |
| 3,961,109 | 6/1976 | Kremer et al. | 427/304 |
| 4,061,588 | 12/1977 | Gulla | 252/429 |
| 4,448,804 | 5/1984 | Amelio et al. | 427/98 |
| 4,481,236 | 11/1984 | Forsterling | 427/97 |
| 4,604,299 | 8/1986 | De Luca et al. | 427/98 |
| 4,891,069 | 1/1990 | Holtzman et al. | 106/1.15 |
| 4,933,010 | 6/1990 | Okabayashi | 106/1.11 |

FOREIGN PATENT DOCUMENTS 0298298 5/1988 European Pat. Off. .
2123036 6/1983 United Kingdom .

OTHER PUBLICATIONS

Matijevic, E. et al., The Characterization of the Stannous Chloride/Palladium Chloride Catalysts for Electroless Plating, *Plating and Surface Finishing*, (reprint), Oct. 1975.

*Primary Examiner*—T. M. Tufariello
*Attorney, Agent, or Firm*—Poms, Smith, Lande & Rose

[57] ABSTRACT

A method for the direct electroplating of a non-conducting substrate and plated substrates so produced are disclosed wherein the non-conducting substrate is first treated with a non-acidic aqueous salt solution containing a micro-fine colloidal distribution of a noble or precious metal and tin to form a strongly adsorbed, uniform, conducting layer of micro-fine colloidal metal cayatalyst upon at least a portion of the substrate surface. The conducting layer is then electroplated directly without the need for electroless plating, conversion coatings, or preferential plating solution additives.

15 Claims, No Drawings

METHOD FOR DIRECTLY ELECTROPLATING A DIELECTRIC SUBSTRATE AND PLATED SUBSTRATE SO PRODUCED

BACKGROUND OF THE INVENTION

1. Field of the Invention

The present invention is directed to a method for directly electroplating metals onto dielectric base materials. More particularly, the present invention is directed to a novel method for directly electroplating metals onto the surfaces of non-conducting or dielectric substrates without the need for preliminary electroless plating, conversion coatings, solution additives, or conductive clips to initiate propagation of plating metal. The method of the present invention is applicable to multi-layer laminated circuit boards and copper clad substrates and is particularly well suited to pattern plating processes, non-clad substrates, and molded circuitry. Moreover, in addition to allowing increased circuit density through the increase of through hole aspect ratios the method of the present invention and the plated substrates so produced eliminate substantial plating and manufacturing costs.

2. Description of the Prior Art

Numerous methods for the metallic plating of dielectric surfaces are known in the art and have proven to be useful in the production of printed electrical circuit boards. Generally speaking, the metallic plating of dielectric surfaces is accomplished by first making the surface catalytically receptive to electrolessly formed metal deposits followed by electrodeposition of a plating metal over the electrolessly formed conductive metal deposits. Though effective at producing conductive metal layers upon non-conducting substrates, such multi-step electroless plating methods are expensive and limited in their application due to the chemical susceptibility of the electroless layer and the need for stringent process control. Further limitations exist on the process of electroless plating because it requires the use of extremely hazardous and toxic materials.

Efforts at overcoming these limitations and at reducing the associated expenses and reducing the health risks through the elimination of the electroless plating step have met with only partial success. Generally, these alternative methodologies substitute additional steps such as coating the substrate with conductive materials in place of the electroless plating. Though direct plating of dielectric materials through the use of graphite coatings or conductive metal powder coatings in place of the electrolessly deposited metal layers has been achieved these methods are equally cumbersome and carry their own disadvantages.

More specifically, early electroless plating catalyst systems consisting of palladium chloride and tin chloride in acidic solutions were developed in the late 1940's and early 1950's. For example, U.S. Pat. No. 2,702.253 (Bergstrom) disclosed a two step procedure in which the dielectric substrate was first sensitized by immersion in an acidic tin chloride solution followed by activation in a palladium chloride solution. Such catalytically activated surfaces would promote the generation of an electrolessly formed metal deposit layer through the oxidation of suitable components contained in an electroless plating bath. This initial electrolessly deposited conductive metal layer could be further plated through conventional electroplating. However, these two step catalyst systems had significant disadvantages.

For example, in the production of printed circuit boards having copper clad conductive surfaces on opposite sides of the insulating dielectric substrate it is a common practice to make electrical connections between the conductors on each side of the circuit board by forming holes through the board and then plating a conducting material on the surface of the "through holes" to interconnect the conducting layers. When utilizing the two step electroless deposition process to plate the surfaces of the through holes with a conducting metal it was found that the palladium chloride solution would produce an unwanted flash coating of palladium metal onto the copper clad surfaces of the substrate which subsequently had to be removed. As a result, this proved to be a wasteful and very expensive process.

Through holes are also utilized to interconnect the conducting layers of multi-layer laminated circuit boards having dozens of conductive layers separated by non-conducting substrate materials. Unfortunately, the acidic catalyst solutions utilized for electroless plating would also attack the black copper oxide layers of the multi-layer substrates, creating cavities or "voids" between the copper layer and the non-conducting layers which could become sites for chemical contamination and corrosion, thus interfering with the conductivity of the layers.

Improvements in the catalytic process involved the formation of a mixed palladium/tin catalytic system which combined the sensitization and activation steps in a single solution. An exemplary system is disclosed in U.S. Pat. No. 3,011,920 (Shipley). These single step catalytic baths were formed of aqueous solutions containing high concentrations of HCl in which varying amounts of palladium chloride and tin chloride were dissolved to produce colloidal suspensions. Though an improvement over the earlier two step catalytic processes, these combined catalytic solutions were subject to instability and indiscriminate deposition of metal onto the walls of plating bath containers and therefore required careful monitoring and control. In spite of these drawbacks, electroless deposition of an initial layer of metal has been an integral part of virtually all processes used for metalizing non-metallic surfaces.

A subsequent attempt to avoid the substantial shortcomings of electroless deposition procedures was disclosed in U.S. Pat. No. 3,099,608 (Radovsky, et al). This process attempted to avoid the need for an electroless plating step by directly electroplating a metal onto a thin, non-conducting layer of semi-colloidal palladium. This non-conductive palladium film was deposited onto the substrate surface utilizing the same palladium/tin catalyst solution used for electroless metal deposition. Though the palladium film layer was non-conductive (resistance was measured at approximately $8 \times 10^7$ ohms per through hole) it was reportedly possible to electroplate over the film. However, deposition of the electroplated metal only began at the interface of a conductive surface and the non-conductive palladium catalyst film layer. Thus, propagation of the electroplated metal layer would grow epitaxially along the palladium layer from this interface and, as a result, direct metal deposition onto this layer was a very slow process. Moreover, it was often necessary to attach a conducting metal plating clip to the substrate in order to initiate electrodeposition at the interface between the clip and the substrate. Without a plating clip this process was limited to electroplating non-conductive substrates in areas in close proximity to a conductive surface. An additional drawback was the requirement of relatively large through holes in order to insure sufficient plating to constitute an effective connector.

An alternative approach to direct plating was disclosed in United Kingdom Patent Application No. GB2,123,036A (Morrissey, et al). This process provided a method for electroplating nonmetallic surfaces without the need for the prior electroless deposition of conducting metal through the use of preferential plating bath additives. As with the earlier methodologies, the non-conducting surface to be plated was first treated with a catalytic palladium/tin solution to form metallic sites on the surface. Electroplating was then accomplished through the utilization of preferential additives in the electroplating solution which were reported to inhibit the deposition of metal onto metal surfaces formed by plating without inhibiting deposition on the catalytically formed metallic sites over the non-conductive surface. As with the previously described direct plating process of U.S. Pat. No. 3,099,608, this method also required the presence of a conductive surface adjacent to the metallic sites for the initiation and propagation of the electroplated metal deposit.

One disadvantage of this methodology was the fact that it was limited to plating relatively large through holes due to the current density requirements of the process. More specifically, the electroplating current density commonly used with this procedure was on the order of 3 to 6 A/dm$^2$. Because the circuit density required to initiate the plating process could not be substantially decreased, decreasing the diameter of the through holes resulted in their becoming filled with metal, thereby limiting the applicability of the process. A further disadvantage of this process was that the electrically deposited metal would plate over the entire conductive surface of cladded substrates in addition to the treated through hole walls. This resulted in the deposit and thus the subsequent removal of additional plating metal, undesirably contributing to the expense of the process.

A further limitation to this process is its inapplicability to modern pattern plating circuit board construction techniques. In pattern plating processes the electrodeposition of metal does not take place until after the substrate has been imaged with a photo resist to form a circuit pattern. As a result, electroplated metal will not cover the entire surface of the substrate. Unfortunately, treatment of the conductive cladding of the substrate prior to application and development of the photo resist utilizes chemicals found to dissolve or desorb the discrete metallic sites previously deposited on the through hole walls. As a result, directly electroplating the through holes is rendered impossible, making the methodology inappropriate for use with pattern plating.

An alternative approach to direct plating was disclosed in European Patent No. 0,298,298A2 (Bladon). This process provided for the electroplating of a non-conducting surface after a conversion treatment which converted an adsorbed colloid surface coating into a chemically resistant "conversion coating" which could function as a base for direct electroplating. A similar process was disclosed in U.S. Pat. No. 4,810,333 (Gulla, et al). Though conversion coatings will withstand the chemical treatments found in pattern plating techniques, these processes are as complex as electroless plating and utilize hazardous chemicals which are difficult and expensive to dispose of. An additional disadvantage of conversion coatings is the relatively high current density required to achieve direct electroplating which limits these processes to plating large through holes.

Accordingly, it is a principle object of the present invention to provide a method for directly electroplating a metal onto the surface of a non-conductive substrate. It is a further object of the present invention to provide a method for directly electroplating a metal layer onto the surface of a non-conducting substrate without the need for conversion treatments or electroplating solution additives.

It is a further additional object of the present invention to provide a method for the direct electroplating of non-conducting substrates that is particularly well suited to utilization in pattern plating processes. Moreover, it is an object of the present invention to provide a process for directly electroplating the surfaces of non-conducting substrates without the need for high plating current densities and correspondingly large through hole diameters.

It is an additional object of the present invention to provide treated substrates and directly electroplated dielectric substrate circuit boards that are particularly well suited for higher circuit density constructions, molded circuits, and multi-layer circuit board applications. It is a further object of the present invention to provide directly electroplated dielectric substrate circuit boards and molded circuits that are pattern plated.

SUMMARY OF THE INVENTION

Generally stated, the present invention accomplishes the above described objectives by providing a novel method for the direct electroplating of metals onto the surfaces of non-conducting materials through the use of a micro-fine colloidal solution of a noble or precious catalytic metal such as palladium and tin to deposit a uniform conductive catalytic metal layer on the surface of the substrate prior to electroplating. The conductive colloidal layer so produced is extremely durable and able to withstand the conditions commonly encountered in pattern plating processes. Moreover, as those skilled in the art will appreciate, the micro-fine colloidal conducting layer of the present invention significantly reduces the current density requirements for direct electroplating and, as a result, routinely and easily produces high density printed circuit boards and molded circuits having unusually small diameter through holes. An additional advantage of the present invention is that the micro-fine catalytic colloid solution is non-acidic and therefore is particularly well suited for use with multi-layer printed circuit boards as it will not attack the copper oxide layers commonly found therein.

More particularly, the method of the present invention comprises the step of directly electroplating a non-conductive substrate having at least a portion of its surface coated with a strongly adsorbed, uniform conducting layer of micro-fine colloidal metal. This can be accomplished by treating the surface of a non-conducting substrate with a solution of a micro-fine colloidal dispersion of palladium and tin to form a uniform, conducting layer of deposited colloidal material followed by the step of electroplating directly over this conductive layer. Where desired, the method can also include the additional step of treating the micro-fine conductive colloidal layer with a mildly basic accelerating solution prior to electroplating. The catalytically treated dielectric substrate can be dried and manipulated following catalytizing treatment without desorbing or otherwise damaging the colloidal conductive layer and therefore may be incorporated into pattern plating processes prior to direct electroplating.

The micro-fine colloidal catalyst solution is formed in a multi-step process utilizing a non-acidic, saturated aqueous salt solution. Preferably, the salt solution will be saturated with sodium chloride or an alternative halide salt. The solution is divided into two portions and an effective amount of a noble or precious metal salt is dissolved in the first portion and a relative molar excess of stannous chloride or other halide salt is dissolved in the second portion. The solutions are then combined and reduced in volume to form a supersaturated concentrate of highly dispersed, uniform, stable, micro-fine colloidal particles. Unlike the prior art catalyst solutions which must be aged and decanted to remove large colloidal particles prior to use, the supersaturated concentrate of the present invention can be stored indefinitely without particulate settling and does not require decanting.

The concentrated catalyst solution is then preferably diluted by a factor on the order of 10 to 1 with an aqueous salt solution to prepare a catalytic bath for dipping the substrates to be plated. Treating the dielectric substrates with the catalyst solution so produced deposits a strongly adsorbed, uniform, conducting layer of micro-fine colloidal metal onto the surface of the substrate. Because the colloidal layer is sufficiently conductive the treated substrate can be utilized as an electrode in an electrolytic cell containing a dissolved plating metal. Passing a current between the catalytically treated substrate electrode and a second electrode immersed in the electrolyte solution directly electroplates the plating metal onto the surface of the substrate.

It should be emphasized that the strongly adsorbed conducting layer of micro-fine colloidal metal deposited on the surface of the treated substrate is remarkably stable and durable. Accordingly, it is possible to further process the treated substrate prior to electroplating without damaging the strongly adsorbed conducting layer of colloidal metal. Such further processing can involve the imaging steps commonly associated with modern pattern plating techniques. Since the strongly adsorbed layer of catalytic metal is conductive, the method of the present invention is particularly well suited for utilization with non-clad substrates and molded circuitry where the initial substrates do not incorporate a layer of bonded copper foil.

An additional benefit of the method of the present invention is that direct electroplating of the strongly adsorbed conducting catalytic layer can take place at significantly reduced current densities relative to conventional substrate plating. As a result, the method of the present invention makes it possible to plate smaller diameter through holes without filling the holes with conductive metal. This feature is advantageous for attaching components to the plated substrate with finer leads and for producing printed circuit boards having higher circuit densities than those previously attainable with the large diameter through hole prior art plating processes.

Further objects, features and advantages of the method of the present invention and the catalytically or electrically plated substrates so produced will become apparent to those skilled in the art from a consideration of the following detailed description.

DETAILED DESCRIPTION OF THE INVENTION

In a broad aspect, the method of the present invention is based upon the surprising discovery that a catalytic noble or precious metal solution such as a palladium chloride/tin chloride solution can be prepared in a non-acidic aqueous salt solution. More importantly, modifications and improvements to these solutions in accordance with the teaching of the present invention produce catalytic colloidal particles that are unusually small and well dispersed relative to those of known or pre-existing catalytic solutions and, as a result, they are extremely effective in adsorbing onto solid surfaces, producing uniform conducting catalyst layers.

Non-acidic catalytic solutions are the general subject matter of the Inventor's co-pending International Application No. PCT/U.S. 89/00102, International Filing Date Jan. 11, 1989, U.S. Pat. application Ser. No. 239,935, Filing Date Sept. 2, 1988, and Japanese Patent Application Serial No. 63/3133, filed Jan. 12, 1988. Refinement to this general class of non-acidic palladium/tin catalyst solutions has resulted in the production of micro-fine catalytic colloidal particles which preferentially adhere to the surface of non-conducting substrates with such uniformity and strength that the metallic surface layer so formed is sufficiently conductive to permit direct electroplating without the need for plating solution additives, conversion coatings, or electroless metal deposition.

What is more, the method of the present invention is particularly applicable to multi-layer circuit boards and copper clad dielectric substrates because the strong adsorbtion of the micro-fine conductive colloidal catalyst layer takes place in the absence of appreciable amounts of HCl and thus does not attack the black copper oxide layers exposed along the surfaces of the circuit board through holes.

Moreover, it should be emphasized that the conductive micro-fine colloidal layer deposited onto dielectric substrate surfaces through the method of the present invention is exceptionally durable. As a result, prior to direct plating, the micro-fine colloidal layer can withstand the processing steps commonly associated with pattern plating and imaging, making the method of the present invention and the circuit boards so produced particularly well suited to contemporary pattern plating processes as well as to use with non-clad substrates and molded circuitry.

Additionally, it will also be appreciated by those skilled in the art that the method of the present invention effectively eliminates the need for costly electroless metal plating methodologies and the associated processing limitations while actually improving the metal plating so produced. Moreover, unlike the prior art methodologies, the present invention eliminates electroless plating while actually decreasing the total number of steps required for effective metal deposition. As an added benefit, eliminating the need for electroless plating, prior art conversion coatings, or solution additives also eliminates the complexity, hazards and cost associated with monitoring, controlling and disposing of the costly solutions associated with these prior art processes. When coupled with the economies available through pattern processing techniques the method of the present invention can eliminate up to 40% of the prior art manufacturing costs normally associated with the production of printed circuit boards.

For purposes of this application, the micro-fine colloidal layer deposited upon the surface of dialectic substrates in accordance with the teachings of the present invention will be referred to as "conductive". By this it is meant that these deposited metal layers exhibit an exceptionally low electrical resistance on the order of from one to tens of ohms, typically ranging between approximately 1 ohm and 50 ohms per through hole. In direct contrast to this relatively high conductivity, the prior art semi-colloidal palladium film layer disclosed in the direct plating methodology of U.S. Pat. No. 3,099,608 (Radovsky, et al) showed a resistance of approximately $8 \times 10^7$ ohms. Similarly, even the most highly conductive catalytic metal layers of the prior art are unable to support direct electroplating of metal on multi-layer boards because of high electrical resistance on the order of 500 ohms to 1,000 ohms. Based upon electrical conductivity alone, it is clear that the preferentially adsorbed micro-fine colloidal layers produced through the method of the present invention are unique and are significantly more uniform and complete than those of the prior art.

The method of the present invention is suitable for the plating and manufacture of a variety of commercial articles where a metal deposit is desired over the surface of a non-conductor. Typical non-conducting substrate materials known in the art to exhibit inadequate conductivity for direct electroplating include plastics, resins, and epoxy materials such as the glass fiber filled epoxy substrates commonly used in the manufacture of printed circuit boards. In that the method of the present invention is especially well suited for the manufacture of printed circuit boards, the exemplary embodiments discussed herein will be directed to the production of printed circuit boards However, it should be emphasized that these exemplary embodiments of the present invention are illustrative only and in no way limit the scope of the present invention to circuit board manufacture alone.

Similarly, the exemplary embodiments of the present invention discussed herein are not limited to the utilization of palladium as the catalytic metal. Rather, other catalytic metals including noble and precious metals may be employed in place of the palladium discussed in detail herein. However, as those skilled in the art will appreciate, palladium and palladium chloride are readily available and have broad applicability and relatively low cost when contrasted to other effective noble or precious metals. Accordingly, while the use of palladium metal catalytic solutions are preferred, the present invention is not limited to the use of palladium.

In contrast to the palladium/tin catalytic solutions of the prior art which are typically formed in concentrated hydrochloric acid solutions, the exemplary micro-fine catalytic colloids of palladium/tin utilized to practice the method of the present invention are formed in a non-acidic, supersaturated, aqueous salt solution. For example, an exemplary micro-fine colloidal solution for use in accordance with the teachings of the present invention can be produced as follows: first, 1 Kg of sodium chloride is added to 3 liters of water and heated to approximately 60° C. to form a saturated solution. Next, 1 Kg of stannous chloride crystals are mixed with a sufficient volume of this saturated salt solution to form 1.9 liters. A slight amount of heat may be necessary to completely dissolve the stannous chloride into this solution. For example, heating the solution to approximately 20° C. to 30° C. with occasional stirring is generally sufficient. Next, in a separate container, 20 g of powdered palladium chloride are added to 200 ml of the saturated salt solution. This palladium solution is stirred and heated to a temperature between about 40° C. to 60° C. until the palladium chloride is completely dissolved. The dissolved palladium chloride salt solution is then added to the stannous chloride salt solution with stirring and heat being applied to raise the temperature to approximately 80° C. plus or minus 2° C. Preferably, this temperature is maintained for approximately one hour to evaporate approximately 5% to 10% of the contents of the solution, creating a supersaturated solution. Following this concentration step the solution is allowed to cool to produce approximately two liters of supersaturated, concentrated micro-fine colloidal palladium/tin salt solution.

It should be noted that the aqueous salt solution is preferably formed of sodium chloride at or near supersaturated concentration. However, other halide salts are contemplated as being within the scope of the present invention though sodium chloride is preferred because of its ready availability and low cost. Additionally, the preliminary salt solution need not be supersaturated as near saturated solutions are sufficient. However, supersaturation will occur during the heating process, as 5% to 10% of the water is evaporated.

A modified micro-fine colloidal catalyst solution can also be prepared utilizing the following technique. As with the previously described salt solution, 1 Kg of sodium chloride is added to 3 liters of water and heated to approximately 60° C. to form a supersaturated solution. Then, prior to the addition of the palladium chloride and stannous chloride previously described , 2 liters of the saturated salt solution are transferred to a separate container into which 3 g of an aromatic aldehyde such as lignin vanillin (in crystallin form) are added. The elevated temperature and stirring are maintained for approximately 30 to 40 minutes until the aldehyde is completely dissolved. This aromatic aldehyde salt solution is then utilized to form the micro-fine palladium tin catalytic solution as previously described. The aromatic aldehyde serves to protect the palladium/tin colloids and to prevent them from agglomerating or coagulating in the salt solution.

Though not essential to the practice of the present invention, the addition of an aromatic aldehyde has the added benefit of further enhancing the adsorbtion characteristics of the catalytic solution and hence the durability and conductivity of the catalytically deposited layer. It is theorized that the aromatic aldehyde palladium/tin colloids are hydrophobic as well as polar and that they therefore preferentially adsorb on the solid surface of the substrate in a manner which leaves the aldehyde closest to the substrate and the tin closest to the liquid with the palladium in between. The colloidal layer thus deposited is both more tightly adsorbed to the substrate and also more easily accelerated because the tin which is stripped during acceleration is closest to the accelerating solution.

The micro-fine catalytic colloidal solution concentrates so produced are preferably diluted prior to use in accordance with the teachings of the present invention. An exemplary dilution factor of approximately 30 to 1 is preferred though other concentrations and ultra-dense catalyst solutions are also contemplated as being within the scope of the present invention. Preferably, the concentrated micro-fine catalytic colloid solution will be diluted on the order of 10 to 1 in a saturated salt solution. No other additives or stabilizers are needed to form this dilute solution. However, a small amount of HCl (approximately 4 ml) or $H_2SO_4$ (approximately 0.5 ml) may be added to prevent the formation of an oxidized tin layer on the subaerial surface of the solution if desired. Alternatively, it is also possible to dilute the concentrated micro-fine catalytic colloid solution in an approximately 5% to 10% salt solution containing from about 0.0005 to 0.001 volume percent sulfuric acid as a stabilizer. Those skilled in the art will appreciate that while these exemplary solutions possess previously unattainable degrees of micro-fine colloidal distribution, they will not require unusual monitoring or control relative to existing catalytic solutions. Additionally, it should be noted that, where desired, the amount of stabilizing acid that may be added to the catalytic solutions is insufficient to chemically interact with black copper oxide.

The micro-fine catalytic colloidal solutions so produced are utilized in accordance with known catalysis procedures to produce the unique conductive colloid layer of the present invention. For example, the surface of a non-conducting substrate to be plated in accordance with the teachings of the present invention can be exposed to the catalyst solution through immersion in a solution bath for a period of time ranging from approximately 7 to 10 minutes, preferably at temperatures varying between approximately 40° C. to 55° C. Additionally, where desired the processing sequence may involve immersion in a catalyst pre-dip solution comprising an aqueous salt solution compatible with the catalytic solution but lacking the micro-fine colloid. As is known in the art, the utilization of a pre-dip solution prevents the contamination of the catalyst by rinse water or other solutions which may be clinging to the surface of the substrate to be treated. This further exemplifies the unique compatibility of the method of the present invention to existing plating technology. An added benefit is realized by the presence of the vanillin in the pre-dip in that it promotes better adsorbtion of the micro-fine colloids by initiating a partial polarization of the substrate surface.

Accordingly, in its broadest aspect the method of the present invention comprises directly electroplating a conductive metal onto an electrically conductive micro-fine catalytic colloid layer deposited onto the surface of the non-conducting substrate to be plated. Electroplating of the treated substrate can be accomplished utilizing the conventional electroplating technique of passing a current between two electrodes immersed in an electrolyte bath containing a dissolved plating metal. Because of the unique conductivity of the preferentially adsorbed, substantially uniform, conducting layer of micro-fine colloidal metal provided on the surface of the dielectric substrate through the method of the present invention it is possible to directly utilize the treated substrate as one of the electrodes in the plating bath. In this manner, the treated substrate is directly electroplated with a layer of metal without the need for a prior electroless plating treatment, conversion coating, or plating solution additives.

Because the present invention allows the use of simple plating solutions without the need for additives, an exemplary plating solution for practicing the method of the present invention can be produced as follows: into each liter of distilled or deionized water a mixture of 80 grams copper sulfate, 180 grams of sulfuric acid, and 30 mg chlorine are dissolved. This produces a typical electroplating solution comprising an aqueous acid solution of the metal desired to be plated. Preferred electroplating metals are copper and nickel, though any desired metal may be directly electroplated in accordance with the teachings of the present invention.

An unprecedented advantage of the method of the present invention is its ability to directly electroplate non-conducting substrates utilizing substantially lower current densities than were previously possible with other dielectric plating methodologies. For example, electroplating current density can vary through a range of from approximately 0.25 amps through 5.0 amps per $dm^2$, when plating the catalytically treated substrates of the present invention. As a result, the method and treated substrates of the present invention effectively enable the production of circuit boards having unusually small diameter through holes to be plated without filling the hole with conductive metal. For example, it is easily possible to plate through holes having diameters in the range of 0.15 mm. Thus, in contrast to prior art plating techniques wherein a through hole aspect ratio of hole depth to hole diameter of 10 to 1 is normal, the method of the present invention routinely and easily plates through holes having an aspect ratio of greater than 20 to 1. As those skilled in the art will appreciate, reducing the size of circuit board through holes facilitates the production of higher circuit density devices which were either impractical or inoperative utilizing prior art techniques.

An additional advantage of the present invention is that direct electroplating is accomplished with simple copper electroplating solution which puts a softer copper deposit on the electroplated substrate. As a result the plated substrates of the present invention are less brittle than those produced through known direct plating and electroless plating methodologies. They are also less prone to cracking because of thermal shock and generally more durable than prior art substrates.

In all other aspects, electroplating the treated substrates of the present invention is generally conventional. For example, the simple plating solution bath used is preferably maintained at a temperature ranging between approximately 25° C. and 30° C. Additionally, electroplating should be continued for a sufficient period of time to form a deposit of desired thickness. Typically, desired circuit board thicknesses range from approximately 0.5 mils to 2.0 mils. A plating time of from approximately 15 to 90 minutes would be sufficient to obtain a deposit of the preferred thickness within the preferred range of plating current density. However, unlike prior art electroplating methodologies wherein pealing or cracking of the plated metal may occur, the electroplated deposits formed by the method of the present invention are strongly bonded to the surface of the non-conductive substrate, free of defects, and uniformly thick as a result of the superior properties of the uniformly deposited catalytic micro-fine colloidal layer. Thus, the bond strength of the electroplated metal is sufficient to withstand solder shock testing as conventionally used in printed circuit board manufacture.

An additional unusual feature of the present invention is the ability to treat the catalytically deposited conducting layer of micro-fine colloidal metal so produced with a mildly basic accelerating solution prior to electroplating. As those skilled in the art will appreciate, conventional plating accelerating solutions are generally strongly acidic or, to a lesser extent, strongly basic solutions. However, the unique properties of the treated substrate of the present invention allow the use of mildly basic accelerating solutions such as dilute sodium or potassium hydroxide solutions or sodium carbonate solutions. For example, a preferred accelerating solution for use in accordance with the teachings of the present invention is an aqueous solution of approximately 200 grams per liter of sodium carbonate. The catalyzed substrate of the present invention can be treated through immersion in a bath of such an accelerator solution, preferably at a temperature of approximately 50° for a period of approximately ten minutes. Following acceleration treatment, the substrate should be rinsed with distilled water to avoid interference with subsequent treatment steps.

In addition, the treated substrates of the present invention are sufficiently strong to physically and chemically resist treatment solutions commonly used in pattern plating processes. As is known in the art, pattern plating involves drying and cleaning the dielectric substrate boards prior to applying and imaging a photoresist film to obtain a desired circuit pattern mask. Imaging the photoresist pattern also involves exposing the substrate to reactive developing and etching solutions prior to electroplating. Prior art catalytic layers are unable to withstand such treatment and will commonly desorb from the surface of a treated substrate making it impossible to electroplate.

A further understanding of the present invention is presented in the following non-limiting examples.

EXAMPLE 1

Direct Panel Electroplate Using Sodium Carbonate Accelerator

A conventional printed circuit board substrate formed of glass fiber and epoxy clad with copper on both surfaces and provided with 8 mil through holes was cleaned, conditioned and dried as known in the art. Basically, the substrate was immersed in a commercial cleaning solution identified as Shipley 1175 Cleaner Conditioner at a temperature of 80° C. for ten minutes followed by a water rinse, soft bristle brush polishing to remove particles and oven drying at 180° C. for 60 minutes. The copper surfaces were micro-etched through immersion in a solution of sodium persulfate ($Na_2S_2O_8$) (200 g/l) and sulfuric acid (5%) at room temperature for one minute followed by a distilled water rinse.

In accordance with the teachings of the present invention, the prepped substrate was immersed in a predip solution of saturated sodium chloride to which vanillin had been added (0.5 g/l) at 45° C. for ten seconds followed directly by immersion in a palladium/tin micro-fine colloidal catalyst solution prepared as discussed above. Briefly, 35 ml of the concentrated, non-acidic saturated aqueous palladium/tin micro-fine colloidal catalyst was diluted with approximately 1 liter of a saturated sodium chloride solution containing 0.5 g/l vanillin and 4 ml/l of hydrochloric acid. The dilute solution was heated to 45° C. and the substrate was immersed into the catalytic solution bath for eight minutes followed by a rinse with distilled water for eight minutes. The catalytically treated substrate was then immersed in a mildly basic accelerating solution of 200 g/l of sodium carbonate at 50° C. for ten minutes followed by a water rinse. The treated substrate was electroplated from a simple acid copper electroplating bath made by mixing copper sulfate (80 grams), sulfuric acid (180 grams) and chlorine (30 m) to each liter of copper electroplating bath. The plating current density was 0.5 to 2.0 amps per square decimeter at a temperature of 28° C. for one-half to one hour. Those skilled in the art will appreciate that amperage and plating time will vary depending on the size of the through holes and the desired thickness of the electroplated copper layer. Following electroplating the plated substrate was rinsed with distilled water. The plated substrate had a uniform, defect free layer of electroplated copper material approximately 1 mil thick.

EXAMPLE 2

Direct Panel Electroplate Using Potassium Hydroxide Accelerator

An identical dielectric substrate was treated as in Example 1 to form a catalytically deposited micro-fine conducting colloidal layer. Following catalysis, the treated substrate was immersed in a basic accelerating solution of potassium hydroxide (200 g/l) at 50° C. for ten minutes, followed by a water rinse. Electroplating was accomplished as described in Example 1 with comparable results.

EXAMPLE 3

Direct Pattern Electroplating Using Permanganate Treatment and Potassium Hydroxide Accelerator A copper clad substrate identical to that utilized in Examples 1 and 2 was immersed in a solution of potassium permanganate (50 g/l) at a temperature of 45° C. for six minutes, followed by a distilled water rinse. The through hole walls were cleaned and conditioned by immersing the substrate in a commercially prepared cleaner conditioner (Shipley 1175) at 80° C. for ten minutes, followed by a water rinse. The copper surfaces were then micro-etched by immersing the substrate in a solution of sodium persulfate (200 g/l) and sulfuric acid (5%) at room temperature for one minute followed by a distilled water rinse. The substrate was pre-dipped and catalyzed as in Example 2 to form a catalytically deposited, micro-fine conducting colloidal layer.

Prior to electroplating a photoresist was applied and imaged as follows: the catalytically treated substrates were dried and cleaned and a film of photoresist (Riston 3015 available from E. I. Deupont De Nemours and Company of Willmington, Del.) was applied at an application temperature between 98° C. and 110° C. and at a speed of from one to three feet per minute. Fifteen minutes following the application of the film the photoresist film was exposed to a source of activation energy through a master to obtain the desired circuit pattern at an exposure of 40 mJ/cm. Fifteen minutes later the imaged photoresist was developed by placing the substrate in a spray chamber utilizing a solution consisting of five pounds of sodium carbonate and one gallon of butyl carbitol per sixty gallons of developer and developed at a temperature of 85° C. for one minute.

The imaged substrate was then immersed in a solution of sodium persulfate (220 g/l) and sulfuric acid (5%) at room temperature for fifteen seconds to micro-etch the copper surfaces prior to rinsing with distilled water. The substrate was then electroplated as described in the previous examples.

It should be noted that for commercial applications of completed pattern printed circuit boards, the plated boards produced in the foregoing example would require the additional steps of solder plating, photoresist removal, and copper surface etching. However, these steps would be unaffected by the direct pattern plating process of the present invention.

EXAMPLE 4

Direct Pattern Plating Utilizing Ultra-Dense Catalyst

A copper clad dielectric substrate was electroplated through the previously described methodology of Example 3. However, the catalyst utilized to form the conductive micro-fine colloidal metal layer was formulated to contain 15 g/l of palladium chloride and 600 g/l of stannous chloride. The plated substrate so produced exhibit a strongly bonded, uniform electroplated layer of copper approximately 1 mil thick.

EXAMPLE 5

Direct pattern plating Utilizing Permanganate Treatment and Sodium Carbonate Accelerator A copper clad substrate identical to that utilized in the previous examples (1–3) was immersed in a solution of potassium permanganate (30 c/1) and caustic soda (20 g/1) at a temperature of 40° C. for 7 minutes, followed by a distilled water rinse. The through hole walls were cleaned and conditioned as in Example 3, except that the immersion time was shortened to 7 minutes. Again, this step was followed by a water rinse.

The substrate was then immersed in a pre-dip of saturated sodium chloride similar to that of Example 1, except that 1.0 g/1 of vanillin were used and the HCl was omitted. Pre-dipping was followed immediately by immersion in an activator solution made by mixing 45 ml of the concentrate with approximately 1 liter of the pre-dip solution containing no HCl and 1.0 g/1 of vanillin. Immersion was continued at 45° C. for 10 minutes. The treated substrate was then accelerated by immersion in a sodium carbonate water rinse. Following acceleration the resistance was measured at 1.3 ohms.

The accelerated substrate was then stabilized by immersion in a 10% solution of $H_2SO_4$ at room temperature for 5 minutes. Following the stabilizing acid rinse, the substrate was imaged as described in Example 3. The patterned substrate was then wetted by immersion in a 3% solution of Sodium Carbonate at room temperature for 2 seconds to remove air from the through holes. The wetted substrate was then soft-etched to remove all foreign material from the copper surfaces, including the activator. Soft-etching was done by immersing the substrate in a solution of 10% $H_2SO_4$ and 5% Hydrogen Peroxide at room temperature for 2 minutes, followed by a water rinse.

The substrate was then electroplated as described in the previous examples, producing a strongly bonded, uniform electroplated layer of copper approximately 1 mil thick.

EXAMPLE 6

Direct Pattern Plating Utilizing Cleaner Conditioner and Sodium Carbonate Accelerator but no Permanganate Treatment An identical substrate was treated as in Example 5 with the only exception being the omission of the initial permanganate step. Following electroplating, the results were as described for Example 4.

Having thus described the preferred exemplary embodiments of the present invention, it should be noted by those skilled in the art that the disclosures herein are exemplary only and that alternatives, adaptations, and modifications may be made within the scope of the present invention. Thus, by way of example and not of limitation, it is contemplated that different catalyst solution concentrations and alternative noble or precious metals may be utilized to form the uniform, conducting, micro-fine catalytically deposited colloidal layers on the substrates of the present invention. Accordingly, the present invention is not limited to the specific embodiments illustrated herein.

What is claimed is:

1. A method for directly electroplating a metal onto the surface of a non-conducting substrate, said method comprising the step of:
    passing a current between two electrodes immersed in an electrolyte containing dissolved plating metal, one of said electrodes being said substrate, said substrate having at least a portion of its surface coated with a substantially uniform, conducting layer of deposited colloidal metal having an electrical resistance of less than 500 ohms.

2. The method of claim 1 further comprising the additional steps of:
    preparing an aqueous saturated salt solution;
    dissolving approximately 100 g per liter noble or precious metal in a first portion of said solution;
    dissolving approximately 500 g per liter of stannous chloride in a second portion of said solution;
    combining one part of said first portion to ten parts of said second portion of said solution;
    reducing the volume of said combined portions to form a supersaturated concentrated catalyst solution; and
    treating at least a portion of the surface of said substrate with said catalyst solution to deposit said uniform, conducting layer of colloidal metal onto said surface prior to passing said current between said substrate and said second electrode.

3. The method of claim 2 wherein said noble metal is palladium.

4. The method of claim 2 further comprising the additional step of treating and deposited conducting layer of colloidal metal with a mildly basic accelerating solution prior to passing said current between said substrate and said second electrode.

5. The method of claim 1 wherein said deposited conducting layer of colloidal metal has an electrical resistance between approximately 1 ohm and 50 ohms.

6. The method of claim 1 wherein said current has a density between approximately 0.25 amp per $dm^2$ and 5.0 amps per $dm^2$.

7. A method for directly electroplating a metal onto the surface of a non-conducting substrate, said method comprising the steps of:
    preparing an aqueous saturated salt solution;
    dissolving approximately 100 g per liter of palladium chloride in a first portion of said solution;
    dissolving approximately 500 g per liter of stannous chloride in a second portion of said solution;
    combining one part of said first portion with ten parts of said second portion of said solution;
    reducing the volume of said combined portions of said solution to form a supersaturated concentrate catalyst solution;
    treating at least a portion of said surface of said substrate with said catalyst solution to deposit a uniform, conducting layer of colloidal metal onto said surface; and passing a current between two electrodes immersed in an electrolyte containing dissolved plating metal, one of said electrodes being said treated substrate.

8. A non-conducting substrate having a conducting metal plated surface formed in accordance with the method of claim 1.

9. The plated non-conducting substrate of claim 8 wherein said substrate is a non-clad circuit or a molded circuit.

10. A method for forming a substantially uniform, conducting layer on at least a portion of the surface of a non-conducting substrate, said method comprising the steps of:

preparing an aqueous saturated salt solution;

dissolving approximately 100 g per liter of palladium chloride in a first portion of said solution;

dissolving approximately 500 g per liter of stannous chloride in a second portion of said solution;

combining one part of said first portion with ten parts of said second portion of said solution;

reducing the volume of said combined portions of said solution to form a supersaturated concentrated catalyst solution;

treating at least a portion of said surface with said catalyst solution to deposit a substantially uniform, conducting layer of colloidal metal on said treated surface.

11. The method of claim 10 further comprising the additional step of dissolving approximately 1.5 g per liter of an aromatic aldehyde in said aqueous saturated salt solution prior to dissolving said palladium chloride and said stannous chloride in said saturated salt solution.

12. A non-conducting substrate having a conducting layer on at least a portion of it surface formed in accordance with the method of claim 10.

13. The non-conducting substrate of claim 12 wherein said conducting layer has an electrical resistance between approximately 1 ohm and 500 ohms.

14. The non-conducting substrate of claim 12 wherein said substrate is a non-clad or molded circuit.

15. A method for the manufacture of a pattern plated dielectric substrate printed circuit board, said method comprising the steps of:

preparing an aqueous saturated salt solution;

dissolving approximately 100 g per liter of palladium chloride in a first portion of said solution;

dissolving approximately 500 g per liter of stannous chloride in a second portion of said solution;

combining one part of said first portion with ten parts of said second portion of said solution;

reducing the volume of said combined portions of said solution to form a supersaturated concentrate;

diluting said supersaturated concentrate to form a catalyst solution;

treating at least a portion of the surface of said substrate with said catalyst solution to deposit a uniform, conducting layer of colloidal metal onto said surface;

applying a photoresist to said treated surface;

imaging said photoresist;

developing said imaged photoresist; and directly electroplating a metal onto said surface.

* * * * *

UNITED STATES PATENT AND TRADEMARK OFFICE
CERTIFICATE OF CORRECTION

PATENT NO. : 5,071,517

DATED : December 10, 1991

INVENTOR(S) : Kiyoshi Okabayashi

It is certified that error appears in the above-identified patent and that said Letters Patent is hereby corrected as shown below:

On the cover page, regarding the name of the Inventor, please delete "Oabayashi" and substitute therefor ---Okabayashi---.

On the cover page, line 8 of the Abstract, please delete "cayatalyst" and substitute therefor ---catalyst---.

Signed and Sealed this

Thirteenth Day of April, 1993

Attest:

STEPHEN G. KUNIN

Attesting Officer     Acting Commissioner of Patents and Trademarks